(12) United States Patent
Wu

(10) Patent No.: US 11,127,705 B2
(45) Date of Patent: Sep. 21, 2021

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventor: Tung-Jiun Wu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 113 days.

(21) Appl. No.: 16/249,500

(22) Filed: Jan. 16, 2019

(65) Prior Publication Data
US 2020/0227368 A1 Jul. 16, 2020

(51) Int. Cl.
*H01L 23/00* (2006.01)
*H01L 23/31* (2006.01)

(52) U.S. Cl.
CPC .......... *H01L 24/13* (2013.01); *H01L 23/3171* (2013.01); *H01L 23/3192* (2013.01); *H01L 24/05* (2013.01); *H01L 2224/0401* (2013.01); *H01L 2224/05073* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05184* (2013.01); *H01L 2224/05582* (2013.01); *H01L 2224/05624* (2013.01); *H01L 2224/05639* (2013.01); *H01L 2224/05644* (2013.01); *H01L 2224/05647* (2013.01);
(Continued)

(58) Field of Classification Search
CPC .......... H01L 2224/13155; H01L 24/75; H01L 2224/05073; H01L 2224/05582; H01L 2224/13655; H01L 2224/05655; H01L 24/64; H01L 24/05; H01L 23/3171; H01L 23/3192; H01L 2224/05155; H01L 2924/014; H01L 2224/05147; H01L 2224/05647; H01L 24/13; H01L 2224/13611; H01L 2224/13144; H01L 2224/13147; H01L 2224/13014; H01L 2224/05664; H01L 2224/05624; H01L 2224/13616; H01L 2224/13639; H01L 2224/13644; H01L 2224/05144; H01L 2224/05139; H01L 2224/05639; H01L 2224/05644; H01L 2224/0401; H01L 2224/05164; H01L 2224/05184; H01L 2224/05124; H01L 2224/03; H01L 2224/13111
See application file for complete search history.

(56) References Cited

U.S. PATENT DOCUMENTS

| 2011/0003470 A1* | 1/2011 | Burgess | H01L 24/11 438/614 |
| 2013/0069221 A1* | 3/2013 | Lee | H01L 24/13 257/737 |
| 2014/0151867 A1* | 6/2014 | Lin | H01L 24/73 257/676 |

* cited by examiner

*Primary Examiner* — Jasmine J Clark
(74) *Attorney, Agent, or Firm* — WPAT, P.C.; Anthony King

(57) ABSTRACT

A semiconductor structure includes a substrate; a conductive pad disposed over the substrate; a passivation disposed over the substrate and covering a portion of the conductive pad; a bump pad disposed over the conductive pad and the passivation; a conductive bump including a conductive pillar disposed over the bump pad and a soldering member disposed over the conductive pillar; and a dielectric member disposed over the passivation and surrounding the conductive pillar.

20 Claims, 10 Drawing Sheets

(52) U.S. Cl.
CPC ............... *H01L 2224/05655* (2013.01); *H01L 2224/05664* (2013.01); *H01L 2224/05684* (2013.01); *H01L 2224/13014* (2013.01); *H01L 2224/1357* (2013.01); *H01L 2224/13144* (2013.01); *H01L 2224/13147* (2013.01); *H01L 2224/13155* (2013.01); *H01L 2224/13611* (2013.01); *H01L 2224/13616* (2013.01); *H01L 2224/13639* (2013.01); *H01L 2224/13644* (2013.01); *H01L 2224/13655* (2013.01); *H01L 2924/014* (2013.01)

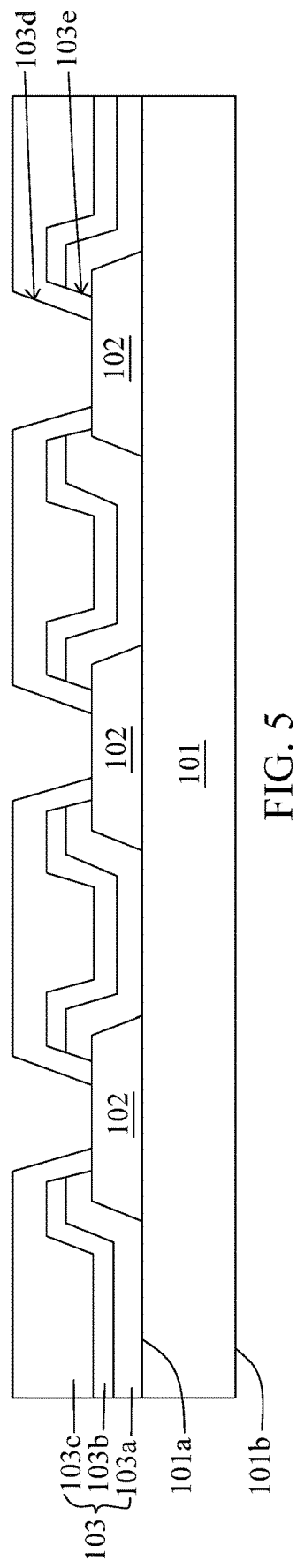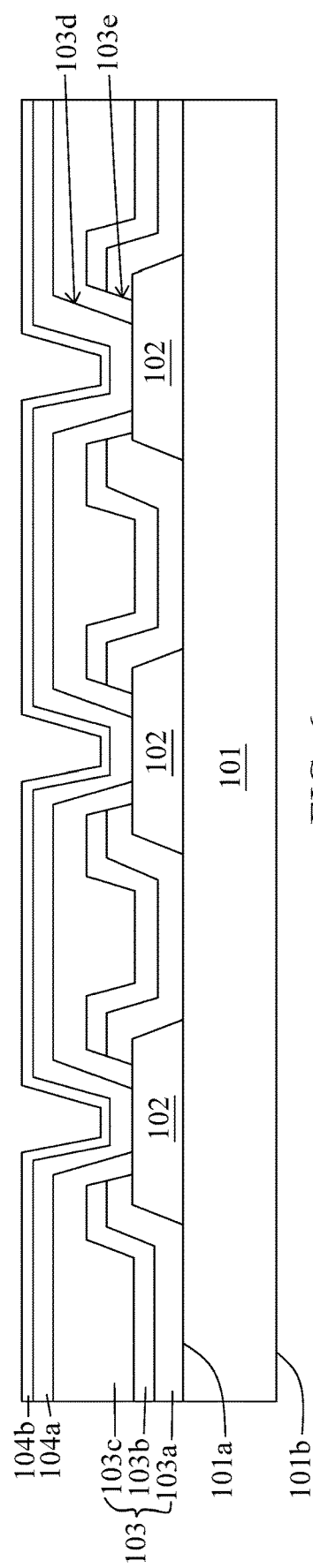

SEMICONDUCTOR STRUCTURE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, delamination of components or other issues, resulting in a high yield loss of the semiconductor device. The semiconductor device is produced in an undesired configuration, which would further exacerbate materials wastage and thus increase the manufacturing cost.

Since more different components with different materials are involved, a complexity of the manufacturing operations of the semiconductor device is increased. As such, there is a continuous need to modify a structure of the semiconductor devices and improve the manufacturing operations of the semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5-14 are schematic views of manufacturing a semiconductor structure by a method of FIG. 4 in accordance with some embodiments of the present disclosure.

DETAILED DESCRIPTION OF THE DISCLOSURE

Figure 1:
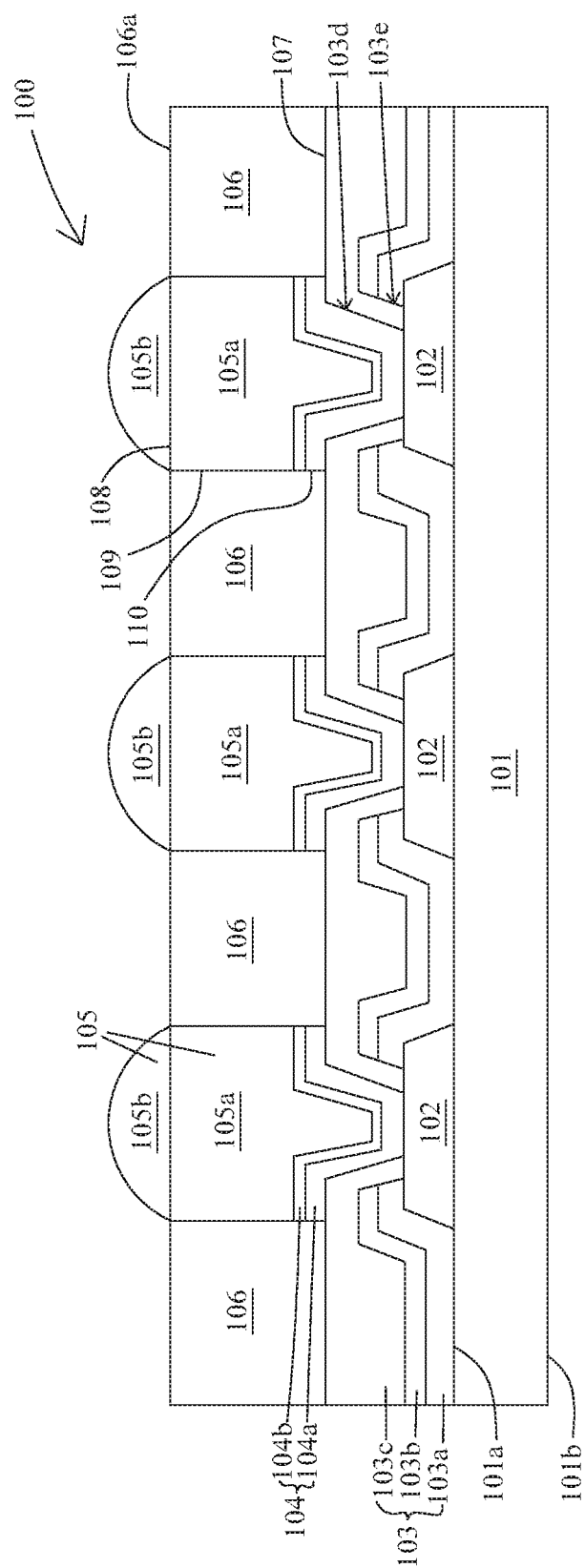
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various components are assembled to form a semiconductor structure. In the semiconductor structure, several circuitries are formed over a substrate. The circuitries include electrical components (such as capacitors, transistors, etc.) and conductive lines connecting the electrical components. The circuitries of the semiconductor structure can be connected with another semiconductor structure through several conductive bumps disposed between the semiconductor structures. The semiconductor structures are bonded with each other by the conductive bumps.

However, such bonding of the semiconductor structures would cause stress on the conductive bumps or other components of the semiconductor structure. As such, cracks would be developed within components of the semiconductor structure, and the components would be delaminated easily. The circuitries and electrical interconnection in the semiconductor structure would be damaged. Therefore, reliability and performance of the semiconductor structure would be adversely affected.

Furthermore, the semiconductor structure involves different kinds of materials (e.g. molding, dielectric layers, electrical interconnect structures, etc.) with different thermal properties (e.g. different coefficient of thermal expansion (CTE), etc.). An internal stress would be easily developed between different materials during or after thermal processes such as heat treatment, reflowing, etc. Such a mismatch of CTE would also cause cracks at where different materials interfacing with each other. The cracks would weaken mechanical strength of the semiconductor structure and cause failure of the electrical interconnection between components.

In the present disclosure, a semiconductor structure is disclosed. The semiconductor structure includes a substrate; a conductive pad disposed over the substrate; a passivation disposed over the substrate and covering a portion of the conductive pad; a bump pad disposed over the conductive pad and the passivation; a conductive bump including a conductive pillar disposed over the bump pad and a soldering member disposed over the conductive pillar; and a dielectric member disposed over the passivation and surrounding the conductive pillar. The conductive pillar is surrounded by the dielectric member. The dielectric member can absorb or reduce stress developed in the bump pad, the passivation and the conductive pad upon integration with other semiconductor structure. As such, development of cracks and delamination of components of the semiconductor structure would be minimized or prevented.

FIG. 1 is a schematic cross sectional view of a semiconductor structure 100 in accordance with various embodiments of the present disclosure. In some embodiments, the semiconductor structure 100 includes a substrate 101, a conductive pad 102, a passivation 103, a bump pad 104, a conductive bump 105 and a dielectric member 106. In some embodiments, the semiconductor structure 100 is a part of a die or a package. In some embodiments, the semiconductor structure 100 is configured to connect with another semiconductor structure such as a printed circuit board (PCB) for chip package interaction (CPI).

In some embodiments, the substrate 101 includes semiconductive materials such as silicon or other suitable materials. In some embodiments, the substrate 101 is a silicon substrate or silicon wafer. In some embodiments, the substrate 101 includes several circuitries disposed over or in the substrate 101. In some embodiments, the circuitries include several electrical components and several conductive lines connecting the electrical components. In some embodiments, the substrate 101 includes metal-insulator-metal (MIM) components such as MIM capacitor. In some embodiments, a dielectric material such as plasma enhanced oxide (PEOX), undoped silicate glass (USG), etc. is disposed over the MIM capacitor.

In some embodiments, the substrate 101 includes a first surface 101a and a second surface 101b opposite to the first surface 101a. In some embodiments, the first surface 101a of the substrate 101 is a front side of the substrate 101. In some embodiments, the second surface 101b is a back side of the substrate 101.

In some embodiments, the conductive pad 102 is disposed over the substrate 101. In some embodiments, the conductive pad 102 is disposed over the first surface 101a of the substrate 101. In some embodiments, the conductive pad 102 is electrically connected to at least one of the circuitries disposed over the substrate 101. In some embodiments, the conductive pad 102 is electrically connected to the MIM component. In some embodiments, the conductive pad 102 is configured to electrically couple with a conductive trace or a conductive structure. In some embodiments, the conductive pad 102 is a part of a conductive line in a redistribution layer (RDL) to re-route a path of circuitry from the substrate 101.

In some embodiments, the conductive pad 102 includes gold, silver, copper, nickel, tungsten, aluminum, palladium and/or alloys thereof. In some embodiments, the conductive pad 102 includes aluminum copper (AlCu) alloy. FIG. 1 illustrates only three conductive pads 102 over the substrate 101 for clarity and simplicity, however, an ordinarily skilled person in the art would readily understand that one or more conductive pads 102 can be present over the substrate 101.

In some embodiments, the passivation 103 is disposed over the substrate 101. In some embodiments, the passivation 103 covers a portion of the conductive pad 102, such that the conductive pad 102 is partially exposed. In some embodiments, the passivation 103 surrounds the conductive pad 102. In some embodiments, a portion of a top surface of the conductive pad 102 is exposed from the passivation 103. In some embodiments, the passivation 103 is configured for providing an electrical insulation and a moisture protection for the substrate 101, so that the substrate 101 is isolated from ambient environment. In some embodiments, the passivation 103 includes dielectric material such as polymer, polyimide (PI), undoped silicate glass (USG), fluorinated silicate glass (FSG), spin-on glass (SOG), silicon oxide, silicon oxynitride, silicon nitride or the like.

In some embodiments, the passivation 103 includes a first layer 103a, a second layer 103b and a third layer 103c stacking over each other. In some embodiments, the first layer 103a is disposed over the substrate 101 and partially covering the conductive pad 102. In some embodiments, the second layer 103b is disposed over the first layer 103a and the substrate 101 and partially covering the conductive pad 102. In some embodiments, the third layer 103c is disposed over the second layer 103b and partially covering the conductive pad 102. In some embodiments, the first layer 103a includes dielectric material such as USG, FSG or the like. In some embodiments, the second layer 103b includes dielectric material such as silicon nitride or the like. In some embodiments, the third layer 103c includes polymer, PI or the like.

In some embodiments, the passivation 103 includes a first recess 103d and a second recess 103e over the conductive pad 102. In some embodiments, the first recess 103d is defined by the third layer 103c of the passivation 103. In some embodiments, the second recess 103e is defined by the first layer 103a and the second layer 103b of the passivation 103. In some embodiments, the second recess 103e surrounds the first recess 103d. In some embodiments, the first recess 103d and the second recess 103e are tapered towards the conductive pad 102. In some embodiments, a thickness of the third layer 103c is substantially greater than a thickness of the second layer 103b and a thickness of the first layer 103a.

In some embodiments, the bump pad 104 is disposed over the conductive pad 102 and the passivation 103. In some embodiments, the bump pad 104 is contacted with the conductive pad 102. In some embodiments, the bump pad 104 is electrically connected to circuitry in the substrate 101. In some embodiments, the bump pad 104 is surrounded by the passivation 103. In some embodiments, a portion of the bump pad 104 is disposed in the first recess 103d and the second recess 103e. In some embodiments, the bump pad 104 is configured to receive a conductive structure. In some embodiments, the bump pad 104 is under bump metallization (UBM) pad. In some embodiments, the bump pad 104 includes gold, silver, copper, nickel, tungsten, aluminum, palladium and/or alloys thereof.

In some embodiments, the bump pad 104 includes a UBM layer 104a and a seed layer 104b disposed over the UBM layer 104a. In some embodiments, the seed layer 104b is conformal to the UBM layer 104a. In some embodiments, the seed layer 104b is configured to facilitate formation of the conductive bump 105 over the bump pad 104. In some embodiments, the seed layer 104b includes conductive material such as copper or the like. FIG. 1 illustrates only three bump pads 104 over the conductive pads 102 for clarity and simplicity, however, an ordinarily skilled person in the art would readily understand that one or more bump pads 104 can be present.

In some embodiments, the conductive bump 105 is disposed over the bump pad 104. In some embodiments, the conductive bump 105 is electrically connected to circuitry in the substrate 101 through the bump pad 104 and the conductive pad 102. FIG. 1 illustrates only three conductive bumps 105 over the bump pads 104 for clarity and simplicity, however, an ordinarily skilled person in the art would readily understand that one or more conductive bumps 105 can be present.

In some embodiments, the conductive bump 105 includes a conductive pillar 105a disposed over the bump pad 104 and a soldering member 105b disposed over the conductive pillar 105a. In some embodiments, the conductive pillar 105a is electrically connected with the bump pad 104. In some embodiments, the conductive pillar 105a is protruded from the bump pad 104. In some embodiments, the conductive pillar 105a is configured to electrically connect to a circuitry or a conductive structure. In some embodiments, the conductive pillar 105a includes conductive material includes solder, copper, nickel, gold or the like. In some embodiments, the conductive pillar 105a is in a cylindrical shape.

In some embodiments, the soldering member 105b is attached to a top surface of the conductive pillar 105a. In some embodiments, the soldering member 105b has a low eutectic point and good adhesion with a conductive structure such as bond pad or the like. In some embodiments, the soldering member 105b is a solder paste mixture of metallic powders and flux. In some embodiments, the soldering member 105b includes tin, lead, silver, copper, nickel or any combinations thereof. In some embodiments, the soldering member 105b is in a dome or hemispherical shape.

In some embodiments, the dielectric member 106 is disposed over the passivation 103. In some embodiments, the passivation 103 is covered by the dielectric member 106. In some embodiments, the passivation 103 is not exposed to the surroundings. In some embodiments, the dielectric member 106 surrounds the conductive bump 105. In some embodiments, the dielectric member 106 surrounds the bump pad 104 and the conductive pillar 105a. In some embodiments, the dielectric member 106 is in contact with the bump pad 104 and the conductive pillar 105a. In some embodiments, the dielectric member 106 is in contact with an outer surface of the conductive pillar 105a and a sidewall of the bump pad 104.

In some embodiments, the soldering member 105b is exposed from the dielectric member 106. In some embodiments, the dielectric member 106 includes an exposed surface 106a exposing to the surroundings. In some embodiments, the conductive pillar 105a is enclosed by the bump pad 104, the dielectric member 106 and the soldering member 105b. In some embodiments, the soldering member 105b is protruded from the conductive pillar 105a and the dielectric member 106. In some embodiments, the dielectric member 106 includes polymer, PI, molding compound or the like. In some embodiments, the dielectric member 106 includes same material as or different material from the passivation 103.

In some embodiments, a first interface 107 is disposed between the dielectric member 106 and the passivation 103. In some embodiments, the first interface 107 is substantially parallel to the first surface 101a of the substrate 101 and the exposed surface 106a of the dielectric member 106. In some embodiments, material of the dielectric member 106 is different from material of the passivation 103. In some embodiments, the dielectric member 106 includes molding compound. In some embodiments, the passivation 103 includes polymer, PI or the like. In some embodiments, material of the dielectric member 106 is different from material of the third layer 103c of the passivation 103. In some embodiments, the third layer 103c includes polymer, PI or the like.

In some embodiments, a second interface 108 is disposed between the soldering member 105b and the conductive pillar 105a. In some embodiments, the second interface 108 is substantially coplanar and horizontally aligned with the exposed surface 106a of the dielectric member 106. In some embodiments, the second interface 108 is substantially parallel to the first interface 107.

In some embodiments, a third interface 109 is disposed between the conductive pillar 105a and the dielectric member 106. In some embodiments, the third interface 109 is substantially orthogonal to the second interface 108 between the soldering member 105b and the conductive pillar 105a, the first interface 107 between the dielectric member 106 and the passivation 103, and the exposed surface 106a of the dielectric member 106.

In some embodiments, a fourth interface 110 is disposed between the bump pad 104 and the dielectric member 106. In some embodiments, the fourth interface 110 is substantially coplanar and vertically aligned with the third interface 109. In some embodiments, the fourth interface 110 is substantially orthogonal to the first interface 107, the second interface 108 and the exposed surface 106a of the dielectric member 106.

Figure 2:
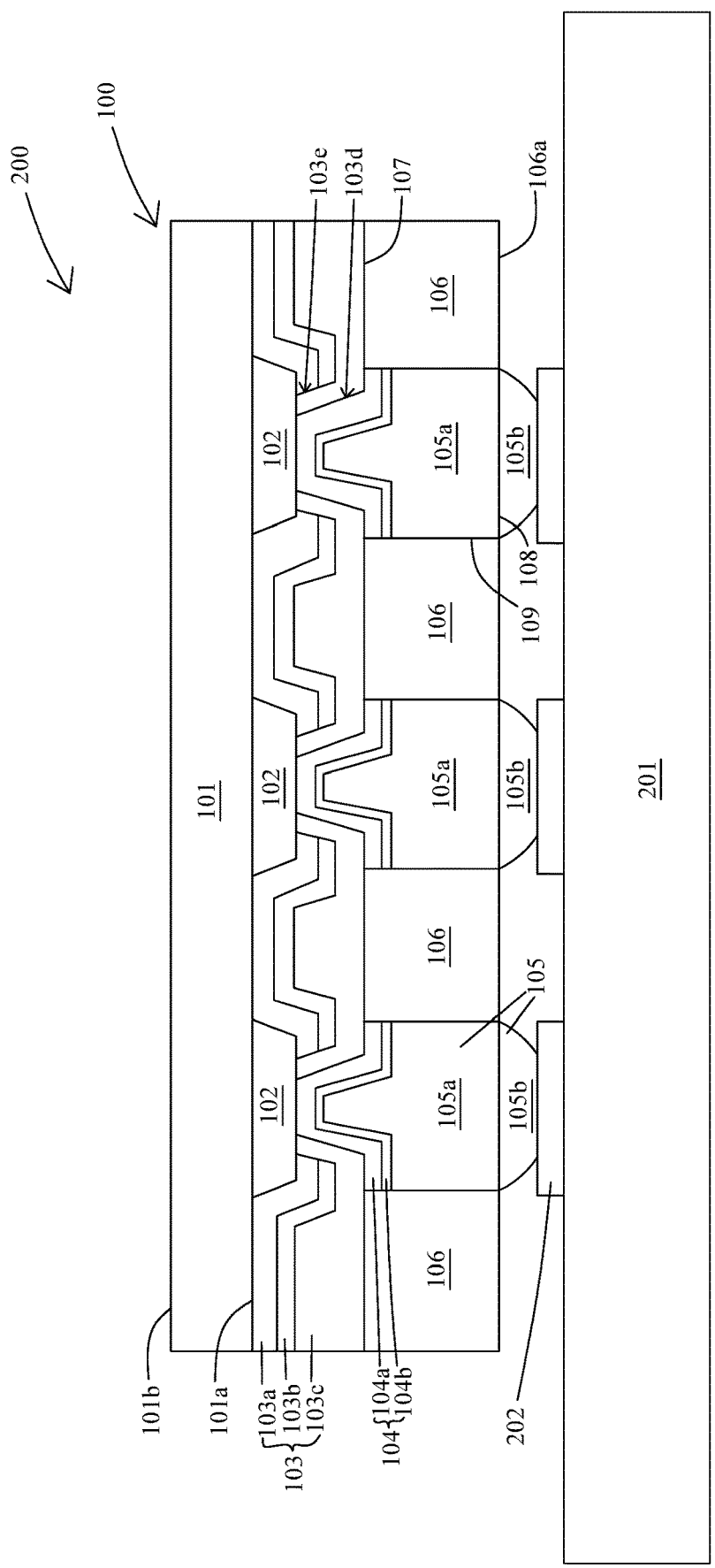
FIG. 2 is a schematic cross sectional view of a semiconductor structure in accordance with some embodiments of the present disclosure.

FIG. 2 is a schematic cross sectional view of a semiconductor structure 200 in accordance with various embodiments of the present disclosure. In some embodiments, the semiconductor structure 200 includes the semiconductor structure 100 of FIG. 1 as described above. In some embodiments, the semiconductor structure 200 includes a second substrate 201 and a second conductive pad 202 disposed over the second substrate 201.

In some embodiments, the second substrate 201 includes a circuitry or device disposed over the second substrate 201. In some embodiments, the second substrate 201 is a printed circuit board (PCB). In some embodiments, the semiconductor structure 100 is disposed over the second substrate 201. In some embodiments, the conductive bump 105 of the semiconductor structure 100 is mounted over the second substrate 201. In some embodiments, the soldering member 105b is bonded with the second conductive pad 202. In some embodiments, a circuitry of the semiconductor structure 100 is electrically connected with a circuitry of the second substrate 201 by the conductive bump 105 and the conductive pad 202.

Figure 3:
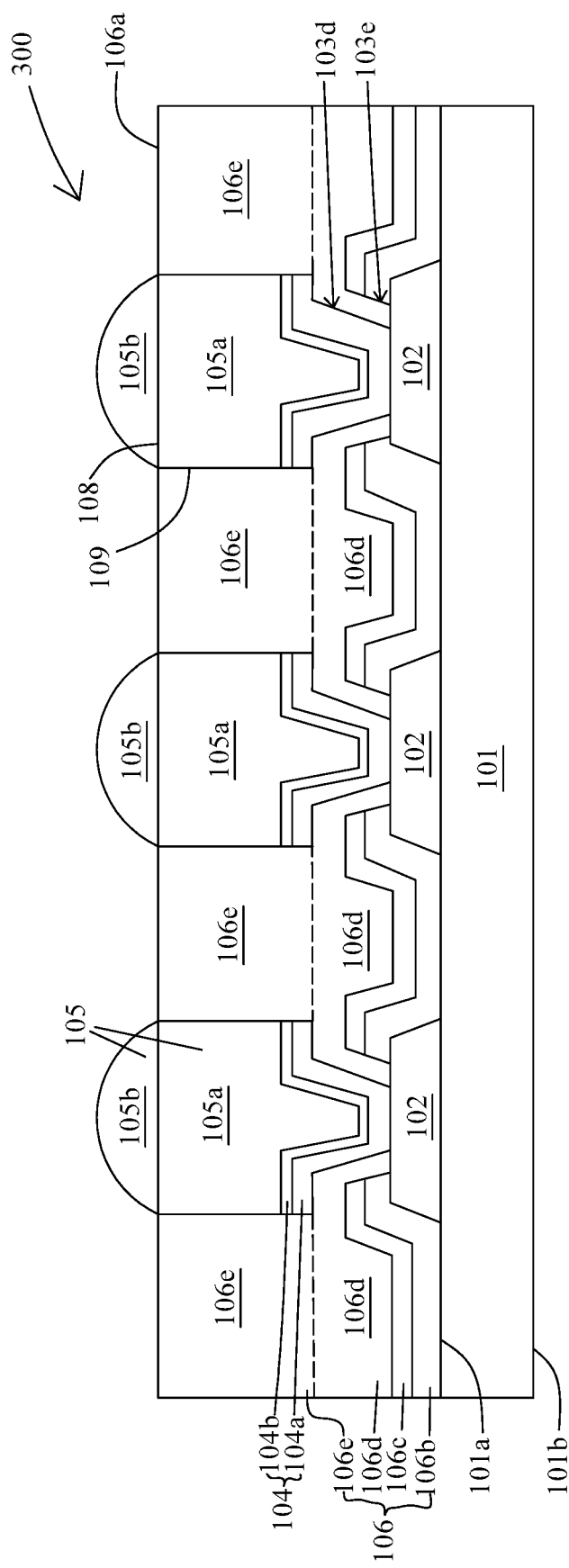
FIG. 3 is a schematic cross sectional view of a semiconductor structure in accordance with some embodiments of the present disclosure.

FIG. 3 is a schematic cross sectional view of a semiconductor structure 300 in accordance with various embodiments of the present disclosure. In some embodiments, the semiconductor structure 300 includes a substrate 101, a conductive pad 102, a bump pad 104 and a conductive bump 105 which are in configurations similar to those described above or shown in FIG. 1.

In some embodiments, the semiconductor structure 300 includes a dielectric member 106 disposed over the substrate 101 and contacting with the conductive pad 102, the bump pad 104 and the conductive bump 105. In some embodiments, the dielectric member 106 is in contact with the conductive pillar 105a. In some embodiments, the first surface 101a of the substrate 101 is in contact with the dielectric member 106. In some embodiments, the dielectric member 106 includes an exposed surface 106a exposed to the surroundings and substantially parallel to the first surface 101a of the substrate 101. In some embodiments, the dielectric member 106 is extended between the first surface 101a of the substrate 101 and the exposed surface 106a of the dielectric member 106. In some embodiments, the soldering member 105b is exposed from the dielectric member 106.

In some embodiments, the dielectric member 106 includes a first layer 106b, a second layer 106c, a third layer 106d and a fourth layer 106e. In some embodiments, the first layer 106b surrounds and contacts with the conductive pad 102. In some embodiments, the first layer 106b is disposed over the substrate 101 and partially covering the conductive pad 102. In some embodiments, the first layer 106b includes dielectric material such as USG, FSG or the like. In some embodiments, the second layer 106c is disposed over the first layer 106b and partially covering the conductive pad 102. In some embodiments, the second layer 106c includes dielectric material such as silicon nitride or the like.

In some embodiments, the third layer 106d surrounds and contacts with the bump pad 104. In some embodiments, the third layer 106d is disposed over the second layer 106c. In some embodiments, the fourth layer 106e surrounds and contacts with the conductive pillar 105a. In some embodiments, the fourth layer 106e is disposed over the third layer 106d. In some embodiments, a portion of the first layer 106b, the second layer 106c and the third layer 106d is at least partially disposed between the conductive pad 102 and the bump pad 104. In some embodiments, the soldering member 105b is exposed from the fourth layer 106e of the dielectric member 106.

In some embodiments, the third layer 106d and the fourth layer 106e is separately or integrally formed. In some embodiments, the third layer 106d and the fourth layer 106e include same material, such that no interface is present between the third layer 106d and the fourth layer 106e. In some embodiments, the third layer 106d and the fourth layer 106e include polymer, PI, molding compound or the like.

Figure 4:
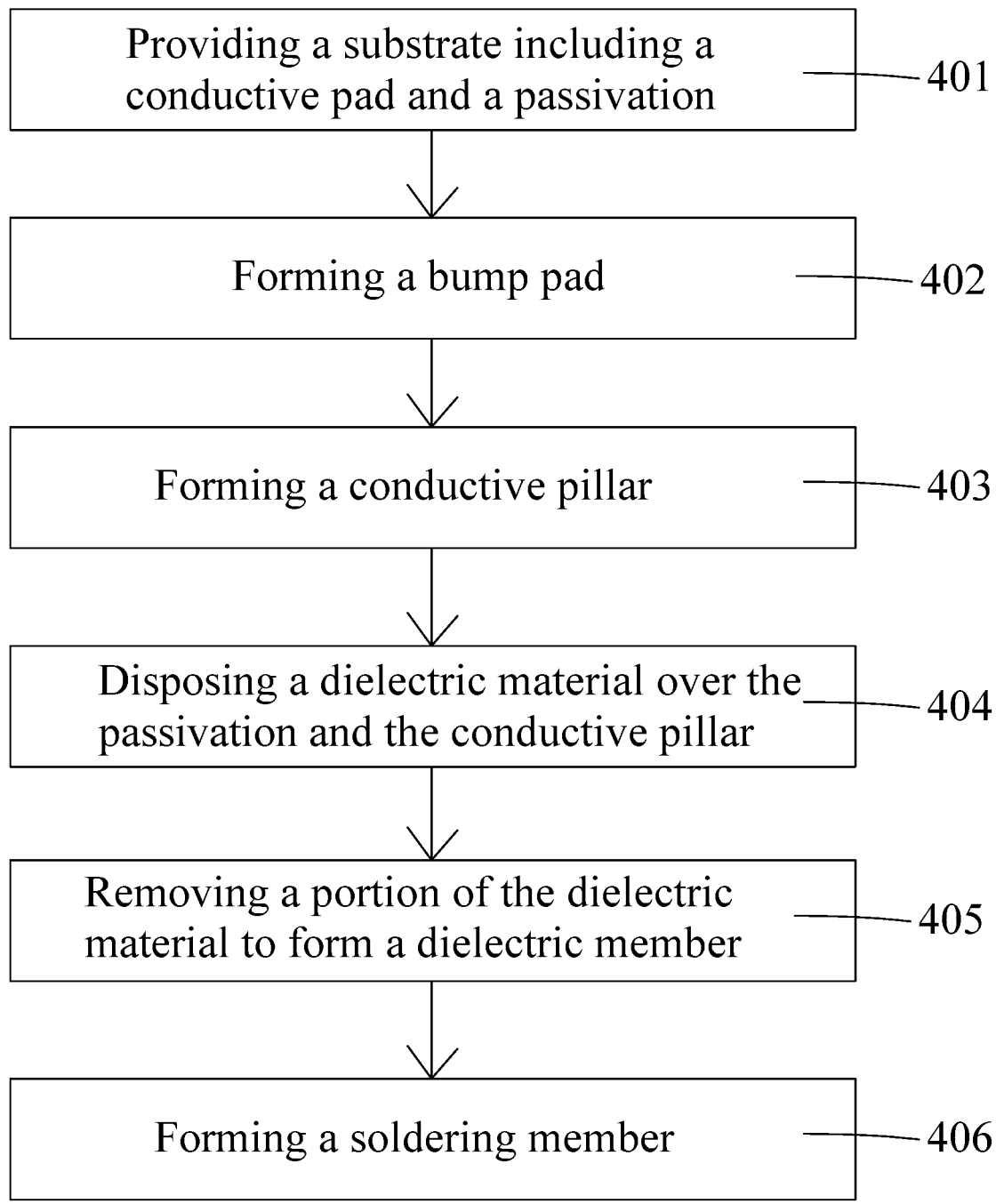
FIG. 4 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method 400. The method 400 includes a number of operations and the description and illustration are not deemed as a limitation as the sequence of the operations. FIG. 4 is an embodiment of the method 400 of manufacturing a semiconductor structure. The method 400 includes a number of operations (401, 402, 403, 404, 405 and 406).

In operation 401, a substrate 101 including a conductive pad 102 and a passivation 103 is provided as shown in FIG. 5. In some embodiments, the conductive pad 102 is disposed over the substrate 101. In some embodiments, the passivation 103 covers a portion of the conductive pad 102. In some embodiments, the substrate 101 includes semiconductive materials such as silicon or other suitable materials. In some embodiments, the substrate 101 includes several circuitries disposed over or in the substrate 101. In some embodiments, the substrate 101 includes a first surface 101a and a second surface 101b opposite to the first surface 101a. In some embodiments, the first surface 101a is an active or a front surface and the second surface 101b is an inactive or a back surface.

In some embodiments, the conductive pad 102 is formed over the first surface 101a of the substrate 101. In some embodiments, the conductive pad 102 is electrically connected to the circuitry of the substrate 101. In some embodiments, the conductive pad 102 is a part of a conductive line in a RDL. In some embodiments, the conductive pad 102 is formed by plating, electroplating, sputtering or any other suitable operations. In some embodiments, the conductive pad 102 includes gold, silver, copper, nickel, tungsten, aluminum, palladium and/or alloys thereof.

In some embodiments, the passivation 103 is disposed over the first surface 101a of the substrate 101 and surrounds the conductive pad 102. In some embodiments, the passivation 103 includes a first layer 103a, a second layer 103b and a third layer 103c. In some embodiments, the first layer 103a is disposed by deposition, chemical vapor deposition (CVD) or any other suitable operations. In some embodiments the first layer 103a includes dielectric material such as USG or the like.

In some embodiments, the second layer 103b is disposed over and conformal to the first layer 103a. In some embodiments, the second layer 103b is disposed by deposition, CVD or any other suitable operations. In some embodiments, the second layer 103b includes dielectric material such as silicon nitride or the like. In some embodiments, a portion of the first layer 103a and the second layer 103b is removed to form a second recess 103e over the conductive pad 102. In some embodiments, the portion of the first layer 103a and the second layer 103b is removed by photolithography, etching or any other suitable operations.

In some embodiments, the third layer 103c is disposed over the second layer 103b. In some embodiments, the third layer 103c is disposed by deposition, CVD or any other suitable operations. In some embodiments, the third layer 103c includes dielectric material such as polymer, PI, molding compound or the like. In some embodiments, a portion of the third layer 103c is removed to form a first recess 103d within the second recess 103e. In some embodiments, the portion of the third layer 103c is removed by photolithography, etching or any other suitable operations. In some embodiments, the substrate 101, the conductive pad 102 and the passivation 103 are in configurations similar to those described above or shown in FIG. 1.

In operation 402, a bump pad 104 is formed over the conductive pad 102 and the passivation 103 as shown in FIGS. 6-9. In some embodiments, the formation of the bump pad 104 includes disposing a UBM layer 104a over the passivation 103 and disposing a seed layer 104b over the UBM layer 104a as shown in FIG. 6. In some embodiments, the UBM layer 104a is disposed over the third layer 103c of the passivation and within the first recess 103d. In some embodiments, the UBM layer 104a is disposed by sputtering, evaporation, electroplating or any other suitable operations. In some embodiments, the UBM layer 104a includes gold, silver, copper, nickel, tungsten, aluminum, palladium and/or alloys thereof. In some embodiments, the seed layer 104b is disposed over the UBM layer 104a. In some embodiments, the seed layer 104b includes conductive material such as copper or the like. In some embodiments, the seed layer 104b is disposed by sputtering, evaporation, electroplating or any other suitable operations.

Figure 7:
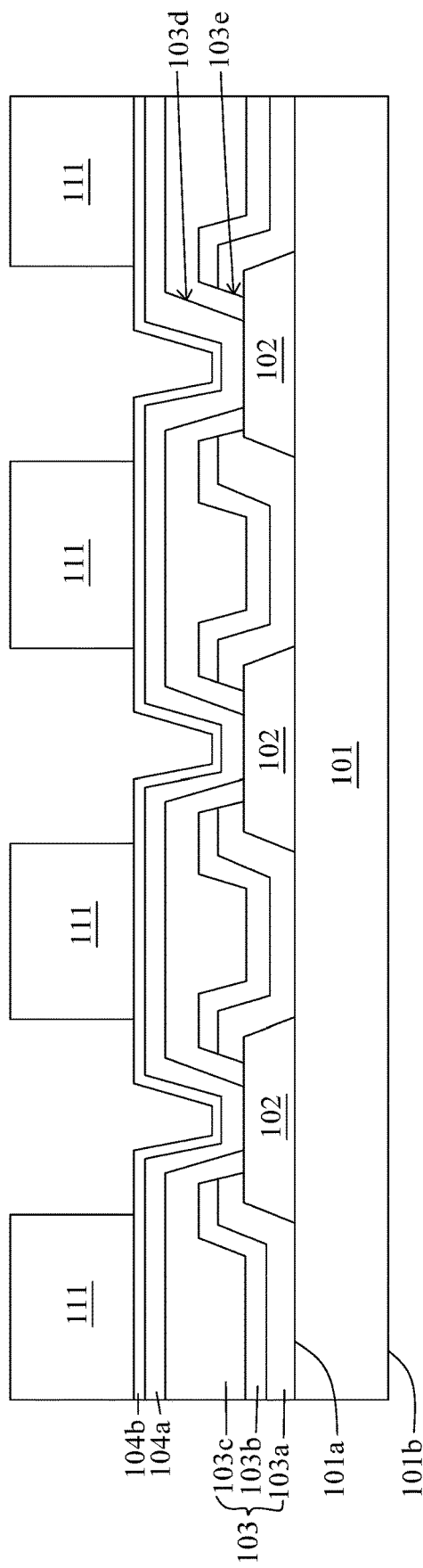

In some embodiments, a photoresist 111 is disposed over the seed layer 104b, and then is patterned as shown in FIG. 7. In some embodiments, the photoresist 111 is disposed by spin coating, sputtering or any other suitable operations. In some embodiments, the photoresist 111 is patterned by removing a portion of the photoresist 111 to expose a portion of the seed layer 104b. In some embodiments, the photoresist 111 is patterned by exposing the photoresist 111 to a predetermined electromagnetic radiation through a mask and removing a portion of the photoresist 111 exposed to the predetermined electromagnetic radiation.

Figure 9:
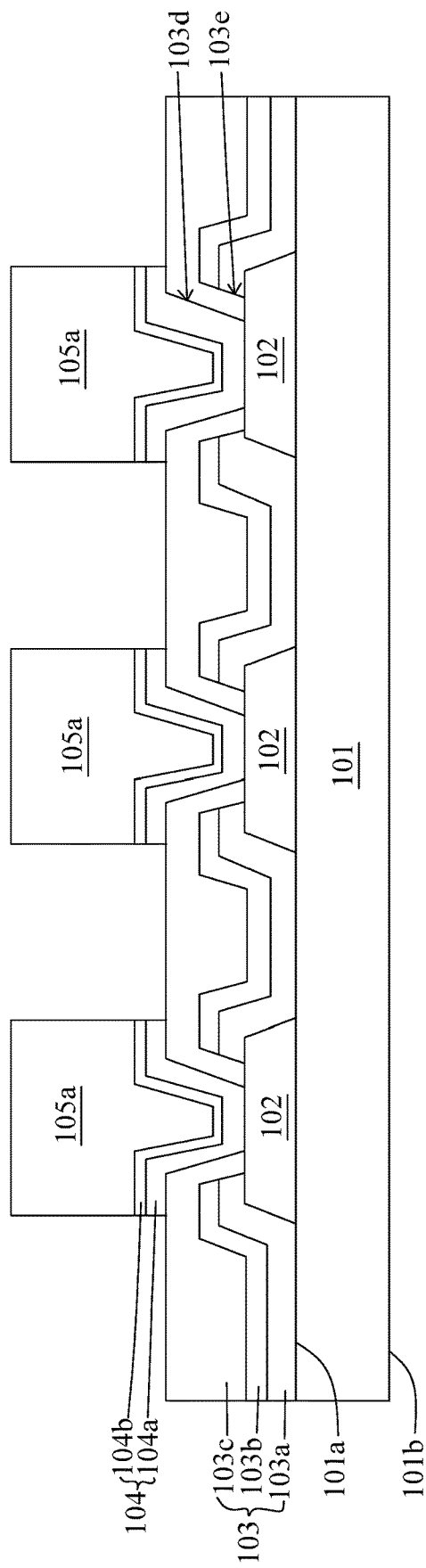

In some embodiments, a portion of the UBM layer 104a and a portion of the seed layer 104b are removed to form the bump pad 104 as shown in FIG. 9 after formation of the conductive pillar 105a (will be discussed below).

Figure 8:
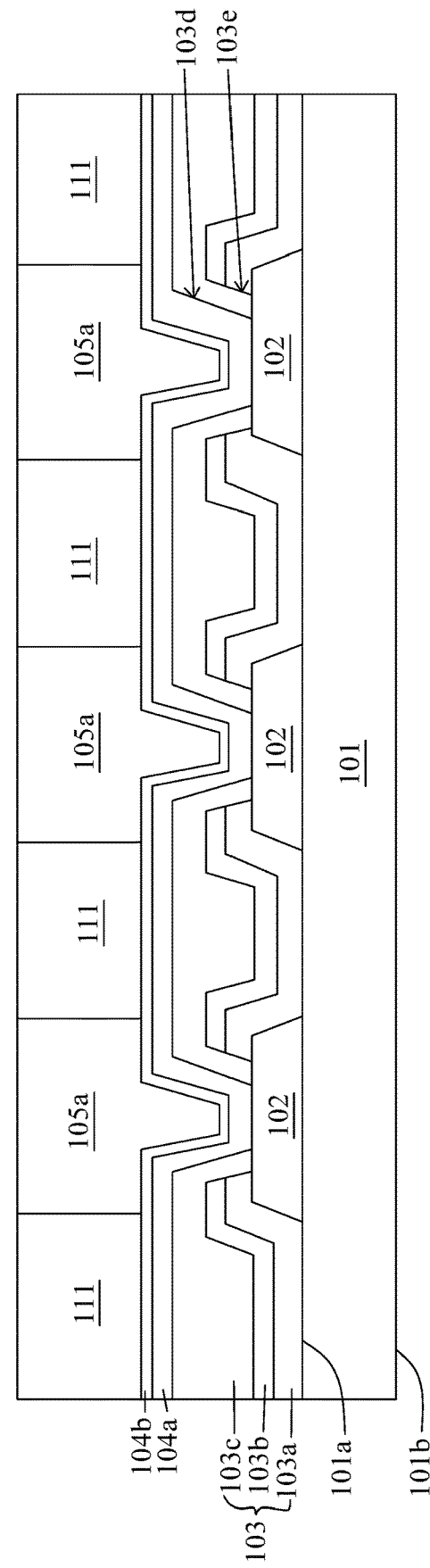

In operation 403, the conductive pillar 105a is formed as shown in FIGS. 8 and 9. In some embodiments as shown in FIG. 8, the conductive pillar 105a is formed after the patterning of the photoresist 111. In some embodiments, the conductive pillar 105a is formed by disposing a conductive material over the seed layer 104b exposed from the photoresist 111. In some embodiments, the conductive material is disposed by sputtering, plating, electroplating or any other suitable operations. In some embodiments, the conductive material includes solder, copper, nickel, gold or the like.

In some embodiments as shown in FIG. 9, the patterned photoresist 111 is removed after the disposing of the conductive material. In some embodiments, the patterned photoresist 111 is removed by stripping, etching or any other suitable operations. In some embodiments, the conductive pillar 105a is formed over the conductive pad 102 and the bump pad 104. In some embodiments, the conductive pillar 105a is in a cylindrical shape.

In some embodiments, a portion of the UBM layer 104a and the seed layer 104b covered by the patterned photoresist 111 is removed to form the bump pad 104. In some embodiments, the portion of the UBM layer 104a and the seed layer 104b is removed by etching or any other suitable operations. In some embodiments, the bump pad 113 is under bump metallization (UBM) pad. In some embodiments, the bump pad 113 includes gold, silver, copper, nickel, tungsten, aluminum, palladium and/or alloys thereof. In some embodiments, the bump pad 104 and the conductive pillar 105a are in configurations similar to those described above or shown in FIG. 1.

Figure 10:
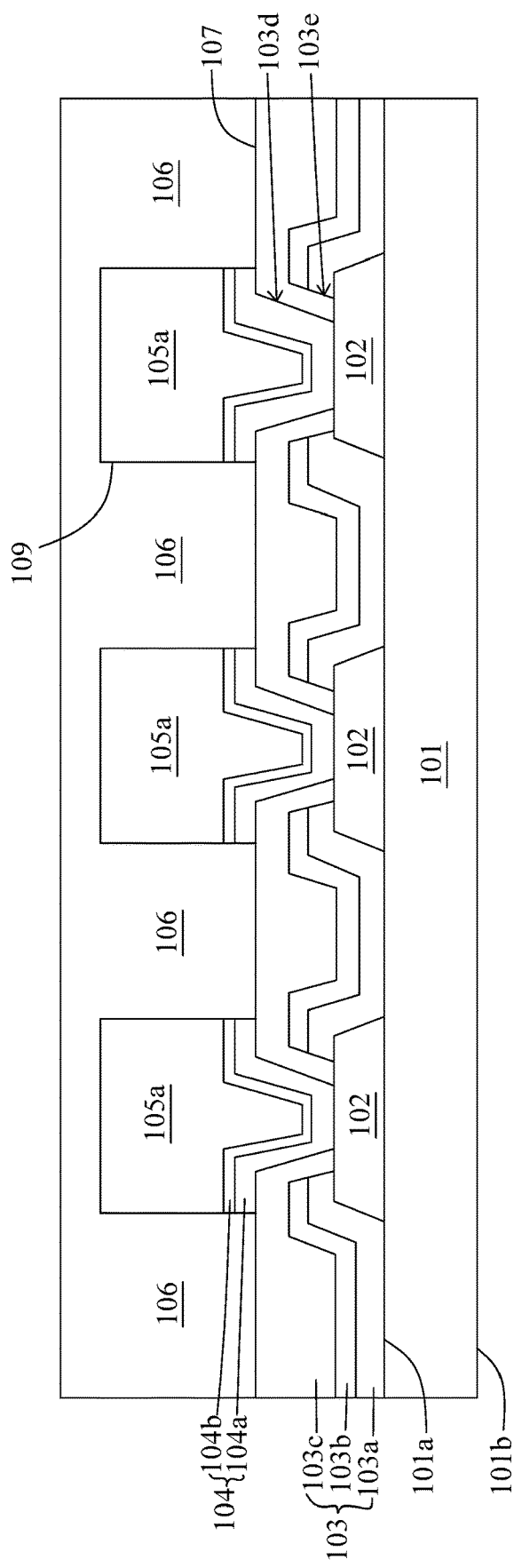

In operation 404, a dielectric material 106 is disposed over the passivation 103 and the conductive pillar 105a as shown in FIG. 10. In some embodiments, the dielectric material 106 surrounds and contacts with the bump pad 104 and the conductive pillar 105a after the disposing of the dielectric material 106. In some embodiments, the conductive pillar 105a is covered by the dielectric material 106. In some embodiments, the dielectric material 106 is disposed by deposition, CVD or any other suitable operations.

In some embodiments, the dielectric material 106 includes same material as or different material from the passivation 103. In some embodiments, the dielectric material 106 includes same material as or different material from the third layer 103c of the passivation 103. In some embodiments, the dielectric material 106 includes polymer, PI, molding compound or the like. In some embodiments as shown in FIG. 10, the dielectric material 106 includes material different from the third layer 103c of the passivation 103. In some embodiments, a first interface 107 is present between the dielectric material 106 and the third layer 103c of the passivation 103. In some embodiments, the dielectric material 106 includes molding compound or the like, and the third layer 103c includes polymer, PI or the like.

Figure 11:
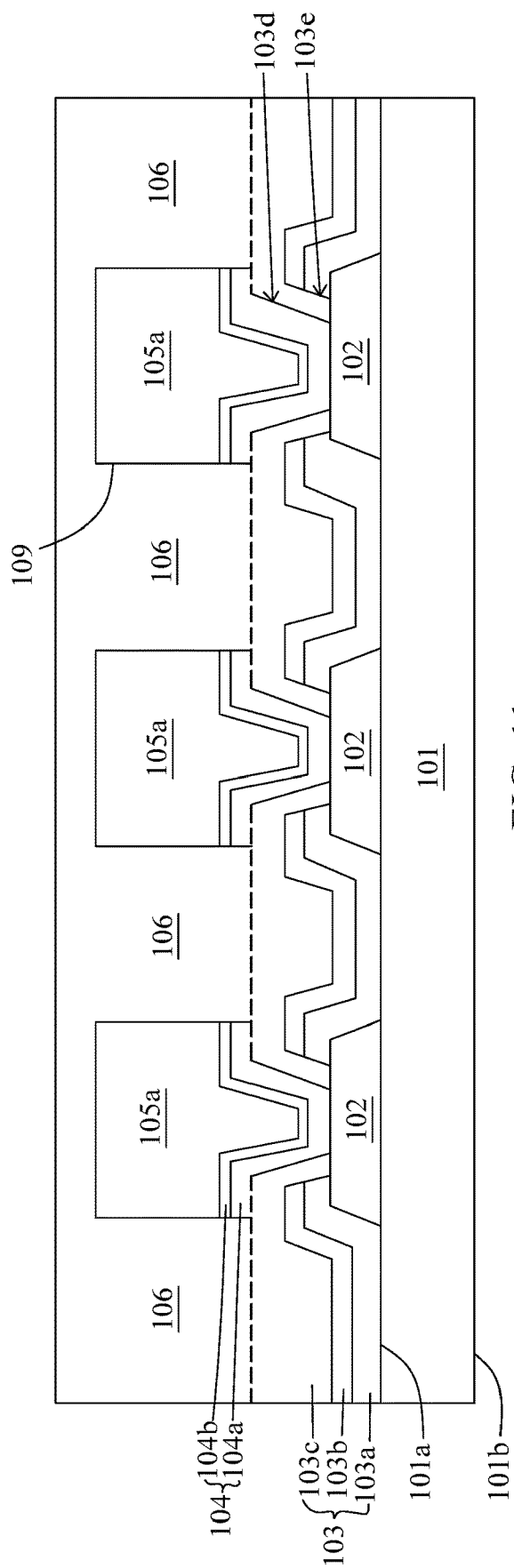

In some embodiments as shown in FIG. 11, the dielectric material 106 includes material same as the third layer 103c of the passivation 103, such that no interface is present between the dielectric material 106 and the third layer 103c of the passivation 103. In some embodiments, the dielectric material 106 and the third layer 103c of the passivation 103 include polymer, PI or the like.

Figure 12:
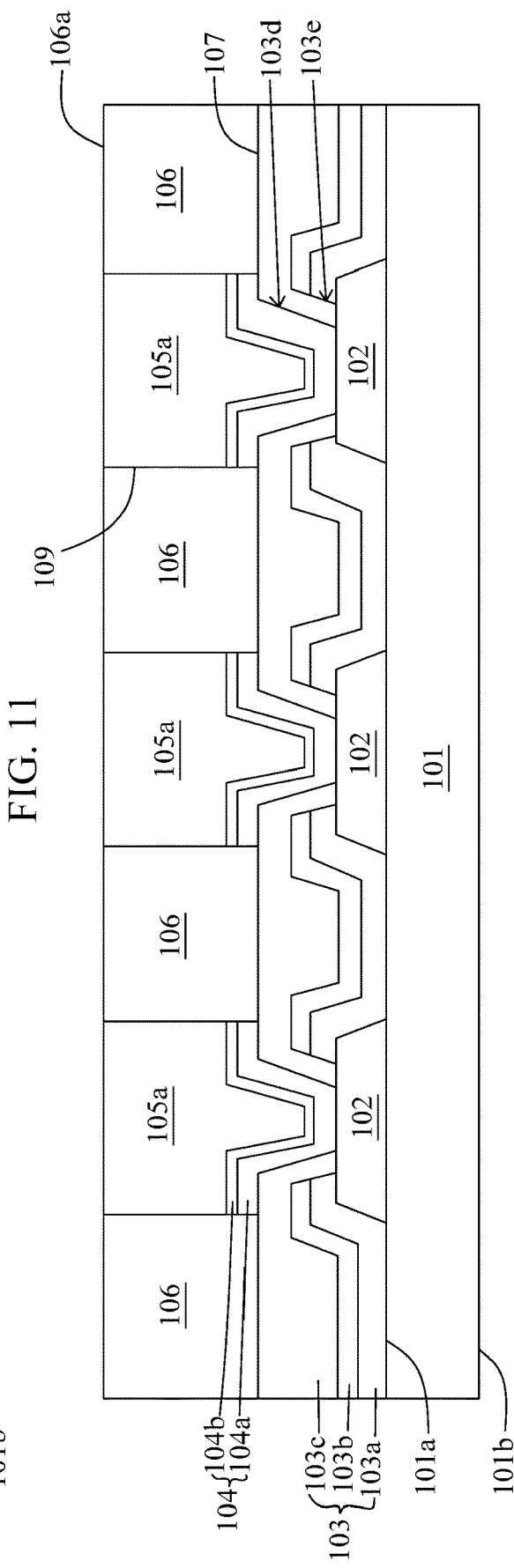

In operation 405, a portion of the dielectric material 106 is removed to form a dielectric member 106 as shown in FIG. 12. In some embodiments, the portion of the dielectric material 106 is removed, such that a portion of the conductive pillar 105a is exposed after the removal of the portion of the dielectric material 106. In some embodiments, a top surface of the conductive pillar 105a is exposed after the removal of the portion of the dielectric material 106. In some embodiments, the top surface of the conductive pillar 105a is coplanar with an exposed surface 106a of the dielectric member 106.

In some embodiments, the portion of the dielectric material 106 is removed by etching, polishing, chemical mechanical planarization (CMP) or any other suitable operations. In some embodiments, the dielectric member 106 is in contact with the conductive pillar 105a. In some embodiments, a third interface 109 between the conductive pillar 105a and the dielectric member 106 is present. In some embodiments, the dielectric member 106 is in configurations similar to the one described above or shown in FIG. 1.

Figure 13:
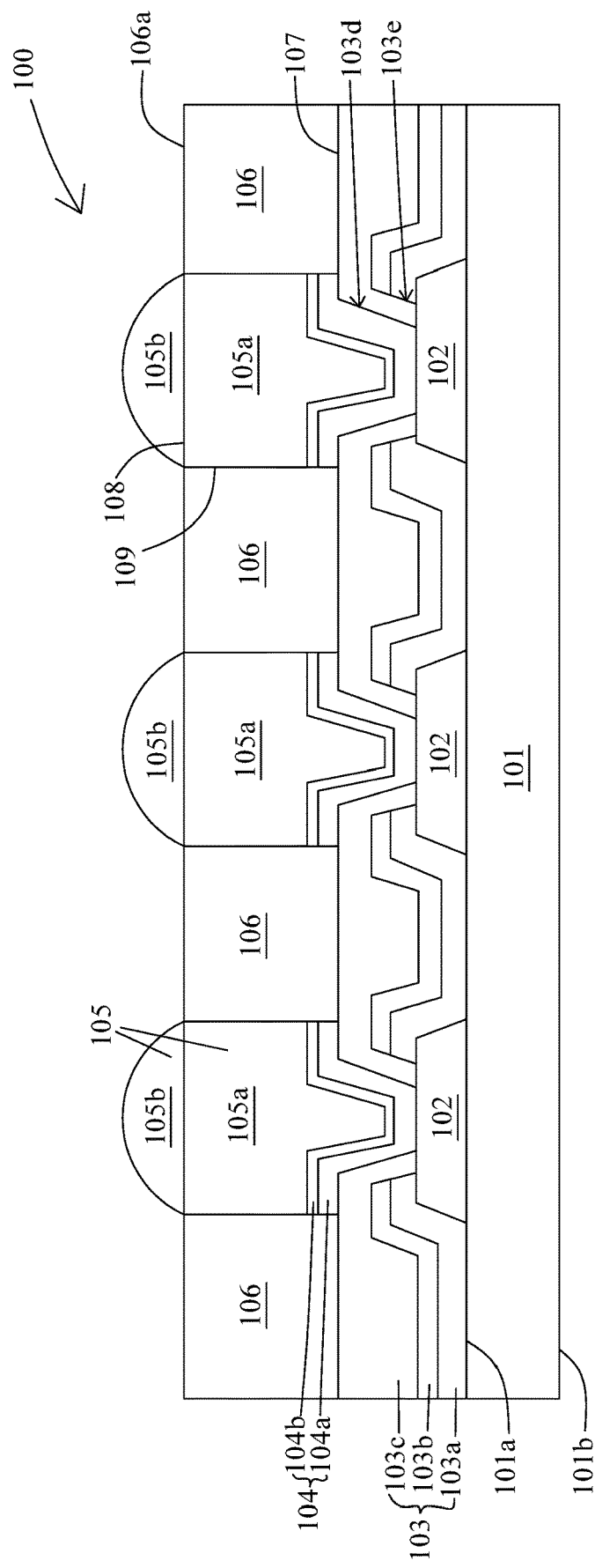

In operation 406, a soldering member 105b is formed over the conductive pillar 105a as shown in FIG. 13. In some embodiments, the soldering member 105b is formed by stencil pasting, mounting, plating or any other suitable operations. In some embodiments, the soldering member 105b is formed by pasting a soldering material over a stencil. In some embodiments, the soldering member 105b includes tin, lead, silver, copper, nickel or any combinations thereof. In some embodiments, the soldering member 105b is in a dome or hemispherical shape after reflowing or curing of the soldering material.

In some embodiments, a second interface 108 between the conductive pillar 105a and the soldering member 105b is present. In some embodiments, the second interface 108 is coplanar with the exposed surface 106a of the dielectric member 106. In some embodiments, the soldering member 105b is in configurations similar to the one described above or shown in FIG. 1. In some embodiments, a semiconductor structure 100 is formed.

Figure 14:
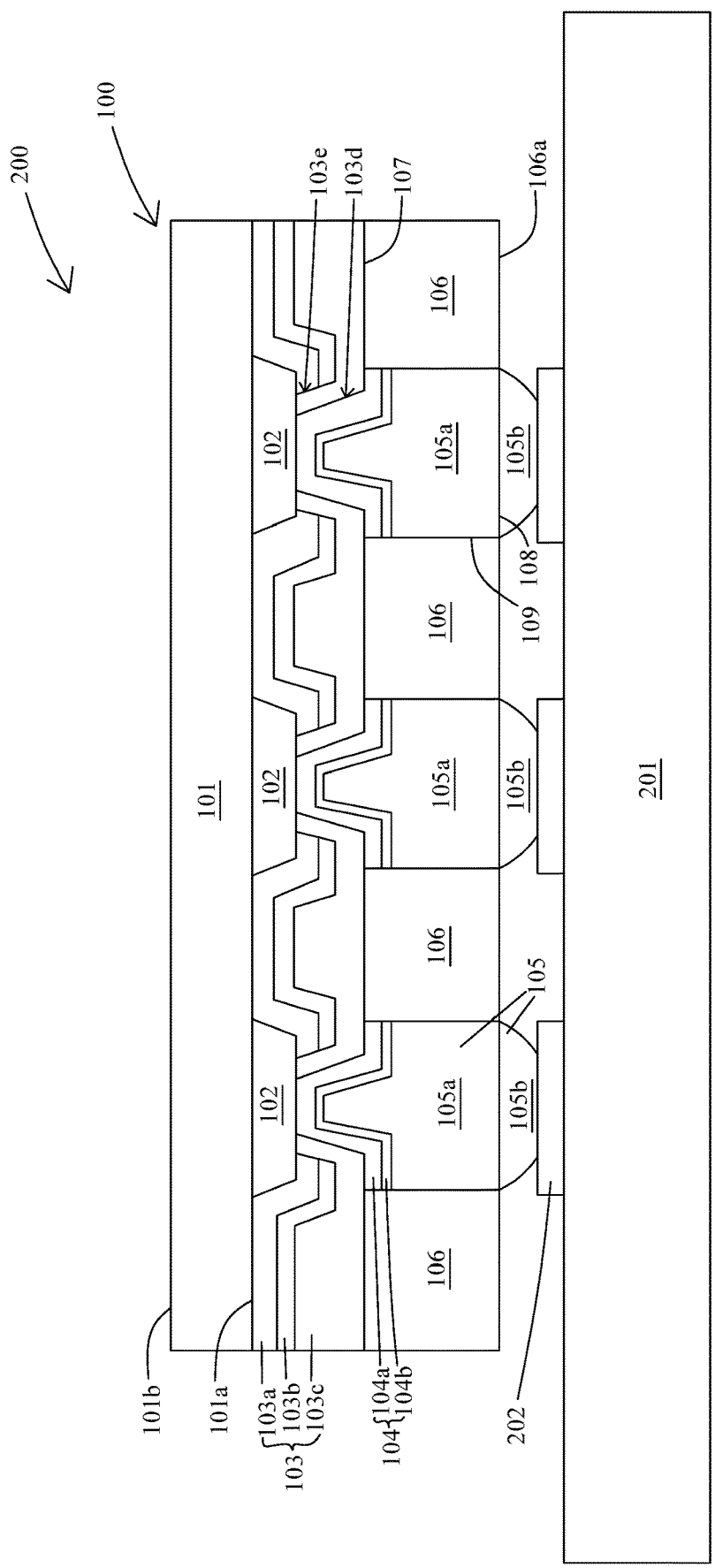

In some embodiments, the semiconductor structure 100 is mounted over a second substrate 201 as shown in FIG. 14. In some embodiments, the soldering member 105b is disposed over and bonded with a second conductive pad 202 of the second substrate 201. In some embodiments, the semiconductor structure 100 is flipped and then bonded with the second substrate 201. In some embodiments, a circuitry of the semiconductor structure 100 is electrically connected with a circuitry of the second substrate 201 by the soldering member 105b and the second conductive pad 202. In some embodiments, the second substrate 201 and the second conductive pad 202 are in configurations similar to those described above or shown in FIG. 2.

In the present disclosure, a semiconductor structure is disclosed. The semiconductor structure includes a substrate; a conductive bump disposed over the substrate and including a conductive pillar and a soldering member; and a dielectric member surrounding the conductive pillar. The dielectric member surrounding the conductive bump can absorb or reduce stress upon integration with other semiconductor structure. As such, development of cracks and delamination of components of the semiconductor structure would be minimized or prevented.

In some embodiments, a semiconductor structure includes a substrate; a conductive pad disposed over the substrate; a passivation disposed over the substrate and covering a portion of the conductive pad; a bump pad disposed over the conductive pad and the passivation; a conductive bump including a conductive pillar disposed over the bump pad and a soldering member disposed over the conductive pillar; and a dielectric member disposed over the passivation and surrounding the conductive pillar.

In some embodiments, the soldering member is exposed from the dielectric member. In some embodiments, the dielectric member is in contact with the bump pad and the conductive pillar. In some embodiments, a first interface is disposed between the dielectric member and the passivation. In some embodiments, material of the dielectric member is different from material of the passivation. In some embodiments, a second interface between the soldering member and the conductive pillar is substantially coplanar with an exposed surface of the dielectric member.

In some embodiments, a third interface between the conductive pillar and the dielectric member is substantially orthogonal to the second interface between the soldering member and the conductive pillar. In some embodiments, the conductive pillar is enclosed by the bump pad, the dielectric member and the soldering member. In some embodiments, the dielectric member includes polymer or molding compound. In some embodiments, the soldering member is protruded from the conductive pillar and the dielectric member. In some embodiments, the passivation is covered by the dielectric member.

In some embodiments, a semiconductor structure includes a substrate; a conductive pad disposed over the substrate; a bump pad disposed over the conductive pad; a conductive bump including a conductive pillar disposed over the bump pad and a soldering member disposed over the conductive pillar; and a dielectric member disposed over the substrate and contacting with the conductive pad, the bump pad and the conductive pillar.

In some embodiments, the dielectric member includes a first layer and a second layer over the first layer, the first layer surrounds and contacts with the bump pad, and the second layer surrounds and contacts with the conductive pillar. In some embodiments, the first layer of the dielectric member and the second layer of the dielectric member include same material. In some embodiments, the first layer of the dielectric member is at least partially disposed between the conductive pad and the bump pad.

In some embodiments, the soldering member is exposed from the second layer of the dielectric member. In some embodiments, the substrate includes a first surface contacting with the dielectric member, the dielectric member includes an exposed surface substantially parallel to the first surface of the substrate, and the dielectric member is extended between the first surface of the substrate and the exposed surface of the dielectric member.

In some embodiments, a method of manufacturing a semiconductor structure includes providing a substrate including a conductive pad disposed over the substrate and a passivation covering a portion of the conductive pad; forming a bump pad over the conductive pad and the passivation; forming a conductive pillar over the portion of the bump pad; disposing a dielectric material over the passivation and the conductive pillar; removing a portion of the dielectric material to form a dielectric member; and forming a soldering member over the conductive pillar.

In some embodiments, a portion of the conductive pillar is exposed after the removal of the portion of the dielectric material. In some embodiments, the dielectric material surrounds and contacts with the bump pad and the conductive pillar after the disposing of the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a conductive pad disposed over the substrate;
   a passivation disposed over the substrate and covering a portion of the conductive pad;
   a bump pad disposed over the conductive pad and the passivation;
   a conductive bump including a conductive pillar disposed over the bump pad and a soldering member disposed over the conductive pillar; and
   a dielectric member disposed over the passivation and surrounding the conductive pillar,
   wherein the soldering member is exposed from the dielectric member, and a first interface is disposed between the dielectric member and the passivation.

2. The semiconductor structure of claim 1, wherein the soldering member is attached to a top surface of the conductive pillar.

3. The semiconductor structure of claim 1, wherein the dielectric member is in contact with the bump pad and the conductive pillar.

4. The semiconductor structure of claim 1, wherein the dielectric member surrounds the bump pad.

5. The semiconductor structure of claim 1, wherein material of the dielectric member is different from material of the passivation.

6. The semiconductor structure of claim 1, wherein a second interface between the soldering member and the conductive pillar is substantially coplanar with an exposed surface of the dielectric member.

7. The semiconductor structure of claim 6, wherein a third interface between the conductive pillar and the dielectric member is substantially orthogonal to the second interface between the soldering member and the conductive pillar.

8. The semiconductor structure of claim 1, wherein the conductive pillar is enclosed by the bump pad, the dielectric member and the soldering member.

9. The semiconductor structure of claim 1, wherein the dielectric member includes polymer or molding compound.

10. The semiconductor structure of claim 1, wherein the soldering member is protruded from the conductive pillar and the dielectric member.

11. The semiconductor structure of claim 1, wherein the passivation is covered by the dielectric member.

12. A semiconductor structure, comprising:
    a substrate;
    a conductive pad disposed over the substrate;
    a bump pad disposed over the conductive pad;
    a conductive bump including a conductive pillar disposed over the bump pad and a soldering member disposed over the conductive pillar; and
    a dielectric member disposed over the substrate and contacting with the conductive pad, the bump pad and the conductive pillar,
    wherein the soldering member is protruded from the dielectric member, the substrate includes a first surface contacting with the dielectric member, the dielectric member includes an exposed surface substantially parallel to the first surface of the substrate, and the dielectric member is extended between the first surface of the substrate and the exposed surface of the dielectric member.

13. The semiconductor structure of claim 12, wherein the dielectric member includes a first layer and a second layer over the first layer, the first layer surrounds and contacts with the bump pad, and the second layer surrounds and contacts with the conductive pillar.

14. The semiconductor structure of claim 13, wherein the first layer of the dielectric member and the second layer of the dielectric member include same material.

15. The semiconductor structure of claim 13, wherein the first layer of the dielectric member is at least partially disposed between the conductive pad and the bump pad.

16. The semiconductor structure of claim 13, wherein the soldering member is exposed from the second layer of the dielectric member.

17. The semiconductor structure of claim 12, wherein the exposed surface of the dielectric member is isolated from the soldering member.

18. A method of manufacturing a semiconductor structure, comprising:
- providing a substrate including a conductive pad disposed over the substrate and a passivation covering a portion of the conductive pad;
- forming a bump pad over the conductive pad and the passivation;
- forming a conductive pillar over the portion of the bump pad;
- disposing a dielectric material over the passivation and the conductive pillar;
- removing a portion of the dielectric material to form a dielectric member; and
- forming a soldering member over the conductive pillar.

19. The method of claim 18, wherein a portion of the conductive pillar is exposed after the removal of the portion of the dielectric material.

20. The method of claim 18, wherein the dielectric material surrounds and contacts with the bump pad and the conductive pillar after the disposing of the dielectric material.

* * * * *